US008916426B2

(12) United States Patent
Clark, Jr. et al.

(10) Patent No.: US 8,916,426 B2
(45) Date of Patent: Dec. 23, 2014

(54) PASSIVE DEVICES FOR FINFET INTEGRATED CIRCUIT TECHNOLOGIES

(75) Inventors: William F. Clark, Jr., Essex Junction, VT (US); Robert J. Gauthier, Jr., Hinesburg, VT (US); Terence B. Hook, Jericho, VT (US); Junjun Li, Williston, VT (US); Theodorus E. Standaert, Clifton Park, NY (US); Thomas A. Wallner, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 13/431,414

(22) Filed: Mar. 27, 2012

(65) Prior Publication Data
US 2013/0256748 A1 Oct. 3, 2013

(51) Int. Cl.
*H01L 21/338* (2006.01)
*H01L 29/66* (2006.01)
*H01L 21/8238* (2006.01)
*H01L 21/84* (2006.01)

(52) U.S. Cl.
CPC ...... *H01L 21/823821* (2013.01); *H01L 21/845* (2013.01)
USPC ........... 438/171; 438/190; 438/210; 438/238; 257/173; 257/516; 257/528

(58) Field of Classification Search
CPC ................... H01L 21/823821; H01L 27/0924; H01L 21/845; H01L 27/1211; H01L 27/0886; H01L 27/10879; H01L 29/78; H01L 29/7833; H01L 27/10826
See application file for complete search history.

(56) References Cited

U.S. PATENT DOCUMENTS

| | | |
|---|---|---|
| 5,894,152 A | 4/1999 | Jaso et al. |
| 6,589,823 B1 | 7/2003 | Beebe et al. |
| 7,105,897 B2 | 9/2006 | Chen et al. |
| 7,148,543 B2 | 12/2006 | Yamada et al. |
| 7,173,310 B2 | 2/2007 | Voldman et al. |
| 7,368,354 B2 | 5/2008 | Anderson et al. |

(Continued)

FOREIGN PATENT DOCUMENTS

JP  2004-047844 A  2/2004

OTHER PUBLICATIONS

"Planar Double-Gate MOSFET", disclosed anonymously, Apr. 28, 2006, www.ip.com.

(Continued)

*Primary Examiner* — Alonzo Chambliss
(74) *Attorney, Agent, or Firm* — Wood, Herron & Evans LLP; Anthony J. Canale

(57) ABSTRACT

Device structures, design structures, and fabrication methods for passive devices that may be used as electrostatic discharge protection devices in fin-type field-effect transistor integrated circuit technologies. A device region is formed in a trench and is coupled with a handle wafer of a semiconductor-on-insulator substrate. The device region extends through a buried insulator layer of the semiconductor-on-insulator substrate toward a top surface of a device layer of the semiconductor-on-insulator substrate. The device region is comprised of lightly-doped semiconductor material. The device structure further includes a doped region formed in the device region and that defines a junction. A portion of the device region is laterally positioned between the doped region and the buried insulator layer of the semiconductor-on-insulator substrate. Another region of the device layer may be patterned to form fins for fin-type field-effect transistors.

11 Claims, 7 Drawing Sheets

(56) References Cited

U.S. PATENT DOCUMENTS

| | | |
|---|---|---|
| 7,538,351 B2 | 5/2009 | Chen et al. |
| 7,838,939 B2 | 11/2010 | Russ et al. |
| 7,923,266 B2 | 4/2011 | Thijs et al. |
| 7,964,893 B2 | 6/2011 | Lee |
| 8,692,291 B2 * | 4/2014 | Clark et al. .................. 257/173 |
| 2006/0084212 A1 | 4/2006 | Anderson et al. |
| 2007/0267676 A1 * | 11/2007 | Kim et al. ..................... 257/311 |
| 2007/0267700 A1 | 11/2007 | Russ et al. |
| 2009/0309167 A1 | 12/2009 | Russ et al. |
| 2010/0093167 A1 * | 4/2010 | Lee et al. ...................... 438/595 |
| 2010/0155776 A1 | 6/2010 | Lee |
| 2010/0163976 A1 * | 7/2010 | Lee et al. ...................... 257/330 |
| 2010/0296213 A1 | 11/2010 | Lee et al. |
| 2013/0119474 A1 * | 5/2013 | Schultz ......................... 257/368 |

OTHER PUBLICATIONS

Davari et al. "Selective SOI and Integration with Planar Oxide Isolated Bulk Devices", Oct. 1, 1992 www.ip.com.

* cited by examiner

PASSIVE DEVICES FOR FINFET INTEGRATED CIRCUIT TECHNOLOGIES

BACKGROUND

The present invention relates to semiconductor device fabrication and, more specifically, to passive devices for fin-type field-effect transistor (FinFET) integrated circuit technologies, design structures for passive devices for use in FinFET integrated circuit technologies, and methods of fabricating passive devices for use in FinFET integrated circuit technologies.

A chip may be exposed to random electrostatic discharge (ESD) events that can direct potentially large and damaging ESD currents to the integrated circuits of the chip. Manufacturers, assemblers, and users of chips often take precautions to avoid causing ESD events or to militate against the effect of an ESD event. One such precaution is to incorporate an ESD prevention circuit into the chip. The ESD protection circuit prevents damage to the sensitive devices of the integrated circuits during post-manufacture handling. The ESD protection circuit may also function to protect the integrated circuits while the chip is installed on a circuit board or other carrier.

In the absence of an ESD event, the ESD protection circuit maintains an ESD protection device in a high-impedance, non-conductive state in which the ESD protection device is electrically isolated from the protected internal circuits. If an ESD event occurs, the ESD protection device is triggered by the ESD protection circuit to change from its non-conductive state to a low-impedance, conductive state. In its conductive state, the ESD protection device directs the ESD current to ground and away from the sensitive devices in the integrated circuits on the chip. The ESD protection device clamps the ESD protection device in its conductive state until the ESD current is drained and the ESD voltage is discharged to an acceptable level.

FinFETs are non-planar devices for use in an integrated circuit of a chip that are capable of being more densely packed than traditional planar complementary metal-oxide-semiconductor (CMOS) transistors. In addition, a FinFET also offers superior short channel scalability, reduced threshold voltage swing, higher mobility, and the ability to operate at lower supply voltages than traditional planar CMOS transistors. Each FinFET features a narrow vertical fin of semiconductor material and a gate electrode that intersects a central channel of the fin. A thin gate dielectric layer separates the gate electrode from the fin. Heavily-doped source and drain regions are formed at opposite ends of the fin and border the central channel.

Improved device structures, fabrication methods, and design structures are needed for passive devices in FinFET integrated circuit technologies.

SUMMARY

According to one embodiment of the present invention, a device structure includes a device region that is coupled with a handle wafer of a semiconductor-on-insulator substrate and extends through a buried insulator layer of the semiconductor-on-insulator substrate toward a top surface of a device layer of the semiconductor-on-insulator substrate. The device region is comprised of lightly-doped semiconductor material. The device structure further includes a doped region in the device region that participates in defining a junction. A portion of the device region is laterally positioned between the doped region and the buried insulator layer of the semiconductor-on-insulator substrate.

According to another embodiment of the present invention, a method is provided for fabricating a device structure using a semiconductor-on-insulator substrate having a device layer, a handle wafer, and a buried insulator layer separating the device layer from the handle wafer. The method includes forming a trench extending from a top surface of the device layer through the buried insulator layer and into the handle wafer. The method further includes forming a device region in the trench that is coupled with the handle wafer and extends through the buried insulator layer toward the top surface of the device layer. A doped region is formed in the device region and participates in defining a junction. The device region is comprised of lightly-doped semiconductor material. A portion of the device region is laterally positioned between the doped region and the buried insulator layer.

According to another embodiment of the present invention, a design structure is provided that is readable by a machine used in design, manufacture, or simulation of an integrated circuit. The design structure includes a device region that is coupled with a handle wafer of a semiconductor-on-insulator substrate and extends through a buried insulator layer the semiconductor-on-insulator substrate toward a top surface of a device layer of the semiconductor-on-insulator substrate. The device region is comprised of lightly-doped semiconductor material. The device structure further includes a doped region in the device region that participates in defining a junction. A portion of the device region is laterally positioned between the doped region and the buried insulator layer of the semiconductor-on-insulator substrate. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
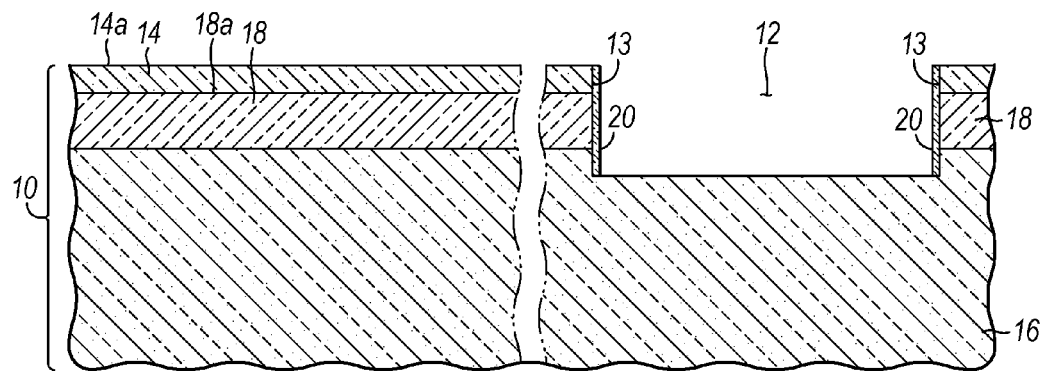
FIGS. 1-4 are cross-sectional views of different portions of a substrate at successive fabrication stages of a processing method for forming one or more FinFETs and a passive device in accordance with an embodiment of the invention.

With reference to FIG. 1 and in accordance with an embodiment of the invention, a semiconductor-on-insulator (SOI) substrate 10 for use in constructing a passive device includes a device layer 14, a handle wafer 16, and a buried insulator layer 18 comprised of an electrical insulator. The buried insulator layer 18 may be a buried oxide layer comprised of silicon dioxide (e.g., $SiO_2$). The device layer 14 is separated from the handle wafer 16 by the intervening buried insulator layer 18 and is in direct contact along a planar interface with a top surface 18a of the buried insulator layer 18. The handle wafer 16 and device layer 14 may be comprised of single crystal or monocrystalline semiconductor material, such as single crystal silicon or another crystalline semiconductor material that contains primarily silicon. The device layer 14, which may be comprised of device-quality semiconductor material, may have a thickness ranging from two (2) nm to 150 nm. The buried insulator layer 18 electrically insulates the handle wafer 16 from the device layer 14, which is considerably thinner than the handle wafer 16. The handle wafer 16 may include a layer of a one conductivity type adjacent to the buried insulator and a bulk thickness of another conductivity type. The SOI substrate 10 may be fabricated by any suitable conventional technique, such as wafer bonding techniques or separation by implantation of oxygen (SIMOX) techniques, familiar to a person having ordinary skill in the art.

A trench 12 extends through the device layer 14 and buried insulator layer 18 into the handle wafer 16. The trench 12 is formed by patterning the constituent materials of the device layer 14, buried insulator layer 18, and the handle wafer 16 using lithography and etch processes and one or more etching chemistries. The lithography process may comprise applying a resist layer to a top surface 14a of device layer 14, exposing the resist layer to radiation projected through a photomask, and developing the exposed resist to provide a patterned resist layer. The patterned resist layer includes openings at the intended locations for the trench 12. The etching process may comprise a reactive ion etch (RIE) or a wet chemical etch, and utilizes the patterned resist layer as an etch mask. The etching process forming the trench 12 may stop on the buried insulator layer 18. The etching process may be continued with a different etching chemistry to extend the trench 12 through buried insulator layer 18 and with yet a different etching chemistry to extend the trench 12 into the handle wafer 16. The resist layer may be subsequently stripped by ashing or solvent stripping.

The trench 12 includes sidewalls 13, which may be vertical relative to the top surface 14a of the device layer 14. The depth of the trench may be 500 nanometers or larger. In one embodiment, the majority of the trench 12 may be located in the handle wafer 16.

Spacers 20 are formed on the sidewalls 13 bounding the trench 12. The spacers 20 may be formed by depositing a conformal layer comprised of an electrical insulator and shaping the conformal layer with an anisotropic etching process, such as a RIE process, that preferentially removes the electrical insulator from horizontal surfaces. At the conclusion of the anisotropic etching process, the spacers 20 constitute residual shapes of electrical insulator residing on the vertical surfaces represented by the sidewalls 13. The conformal layer used to form spacers 20 may comprise, for example, silicon nitride ($Si_3N_4$) deposited by chemical vapor deposition (CVD).

Figure 2:
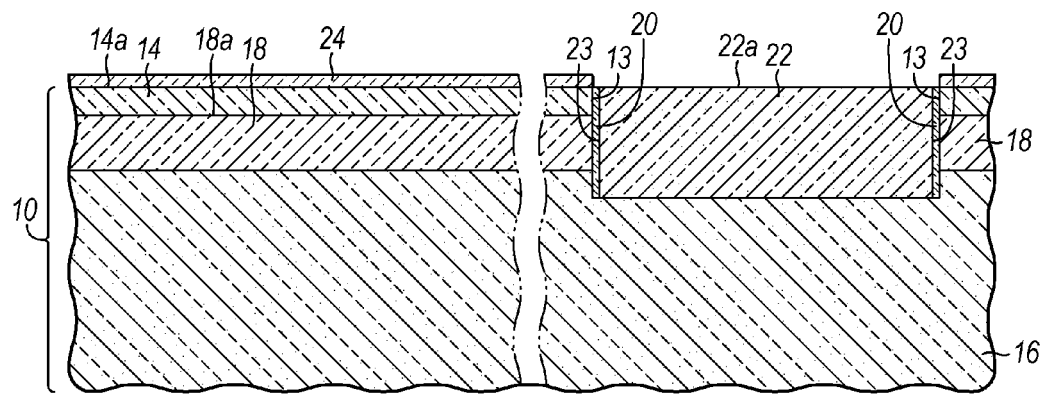

With reference to FIG. 2 in which like reference numerals refer to like features in FIG. 1 and at a subsequent fabrication stage, the trench 12 is filled by a plug 22 of semiconductor material doped with a particular conductivity type. The plug 22 provides a device region subsequently used to construct a passive device. The plug 22 has exterior sidewalls 23 that are coextensive with the spacer-covered interior sidewalls 13 of the trench 12.

The plug 22 may be comprised of silicon formed by a selective epitaxial growth (SEG) process. The semiconductor material of handle wafer 16 operates as a seed crystal or crystalline seed that establishes a crystallographic pattern for the semiconductor material in plug 22 in which the crystallographic pattern of handle wafer 16 is reproduced so that plug 22 and the handle wafer 16 nominally have the same lattice structure and crystalline orientation. The SEG process may be conducted at a sub-atmospheric process pressure (e.g., 40 torr) and typically with the substrate 10 heated to a temperature between about 450° C. and about 1050° C. The spacers 20 inhibit epitaxial growth of the semiconductor material from the sidewalls 13.

The plug 22 may be doped to have a conductivity type and, in particular, may be semiconductor material having an opposite conductivity type from the handle wafer 16 immediately beneath and surrounding the trench 12. In one embodiment, the plug 22 may be in situ doped during growth with an impurity species from Group III of the Periodic Table (e.g., boron (B), aluminum (Al), gallium (Ga), or indium (In)) so that the plug 22 has a p-type conductivity. A hardmask 24 is formed on the top surface 14a of the device layer 14 to prevent epitaxial growth of semiconductor material thereupon. After the plug 22 is formed, the hardmask 24 and any semiconductor material thereupon is removed using a chemical-mechanical polishing (CMP) process so that a top surface 22a of the plug 22 and the top surface 14a of the device layer 14 are nominally coplanar.

The plug 22 is lightly-doped with the dopant added during epitaxial growth. As used herein, the dopant concentration in semiconductor material that is considered heavily doped may be at least an order of magnitude higher than the dopant concentration in semiconductor material that is considered lightly doped. The relative dopant concentrations for heavily-doped semiconductor material and lightly-doped semiconductor material are understood by a person having ordinary skill in the art. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

Figure 3:
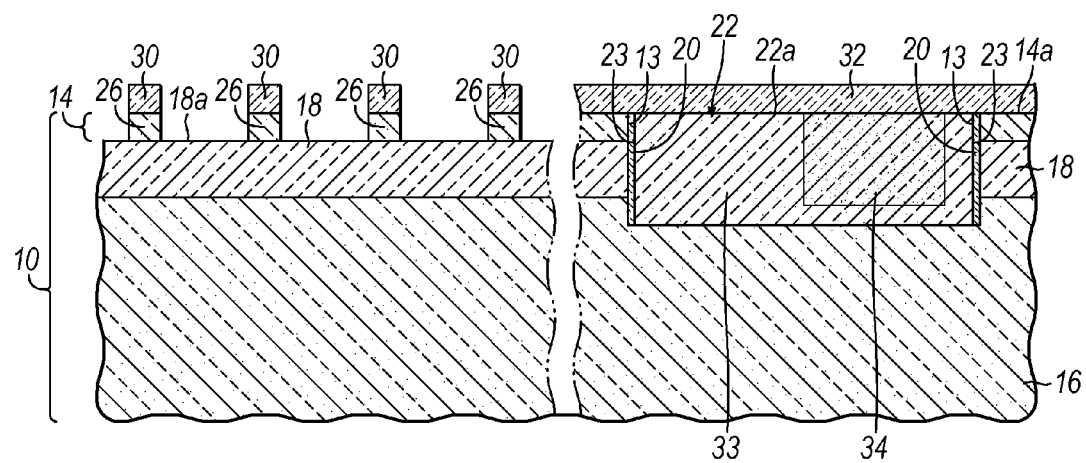

With reference to FIG. 3 in which like reference numerals refer to like features in FIG. 2 and at a subsequent fabrication stage, a plurality of fins 26 for constructing one or more fin-type field-effect transistors (FinFETs) are formed from the device layer 14 of the SOI substrate 10. The fins 26 are covered by dielectric caps 30 and the plug 22 is covered by an unpatterned section of cap material layer 32 used to form the dielectric caps 30. In one embodiment, the dielectric caps 30 and cap material layer 32 may be comprised of $SiO_2$. The fins 26, as well as dielectric caps 30, may be formed by photolithography and subtractive etching processes. To that end, the unpatterned device layer 14 and plug 22 are covered by the cap material layer 32 that etches selectively to (i.e., at a higher etch rate than) the semiconductor materials comprising the device layer 14 and plug 22. The cap material layer may be, for example, $SiO_2$ grown by thermally oxidizing the top surface 14a of device layer 14 and the top surface 22a of the plug 22.

A layer of a sacrificial material, such as polysilicon, is deposited on the top surface of the cap material layer. Before the fins 26 are formed using the sacrificial material layer, a well 34 is formed in the plug 22 using an ion implantation process. The semiconductor material comprising the well 34 has an opposite conductivity type from the semiconductor material comprising the plug 22 that retains the original conductivity type. The result is that the portion of the plug 22 that retains the original conductivity type defines a well 33 defining a doped region of the opposite conductivity type from well 34. The wells 33, 34 are adjacent to each other in a juxtaposed relationship and are coupled along a boundary across which the conductivity type changes to define a p-n junction, as discussed further hereinbelow. A portion of well 33 is disposed between well 34 and the remainder of the handle wafer 16.

The implantation conditions for forming well 34 are selected to provide a desired depth profile for the doping concentration and may include multiple implantation conditions. In one embodiment, the well 34 may be a lightly-doped n-well with the constituent semiconductor material having an n-type conductivity supplied by implanting ions of an impurity species from Group V of the Periodic Table (e.g., phosphorus (P), arsenic (As), or antimony (Sb)). The ions counterdope the semiconductor material of the plug 22 so that the well 34 has the opposite conductivity type from the well 33.

The fins 26 may be formed using, for example, a sidewall image transfer (SIT) process. The sacrificial material layer is patterned to define mandrels in the region of the device layer 14 used to form the fins 26. Spacers are then formed on the sidewalls of the mandrels. The mandrels are arranged such that the spacers are formed at the intended locations for the fins 26. The spacers may be formed from a sacrificial material that is shaped by an anisotropic etching process, such as RIE, that preferentially removes the dielectric material from horizontal surfaces. The sacrificial material used to form the spacers may comprise, for example, $Si_3N_4$ deposited by CVD. The mandrels are then selectively removed relative to the spacers using an etching process, such as RIE. The cap material layer and the device layer 14 are patterned with an etching process, such as RIE, using one or more etching chemistries while each spacer operates as an individual etch mask for one of the fins 26 and its dielectric cap 30. The etching process stops on the top surface 18a of the buried insulator layer 18. The spacers are removed from their respective locations atop the dielectric caps 30.

Each of fins 26 is constituted by a three-dimensional block of semiconductor material originating from the device layer 14 and each of the fins 26 is covered by one of the dielectric caps 30. Each of the fins 26 has a bottom surface that is in direct contact with a top surface 18a of the buried insulator layer 18.

During the SIT process forming the fins 26, a resist mask is applied to cover the plug 22 and the overlying cap material layer 32. After the SIT process is completed, the resist mask is removed.

Figure 4:
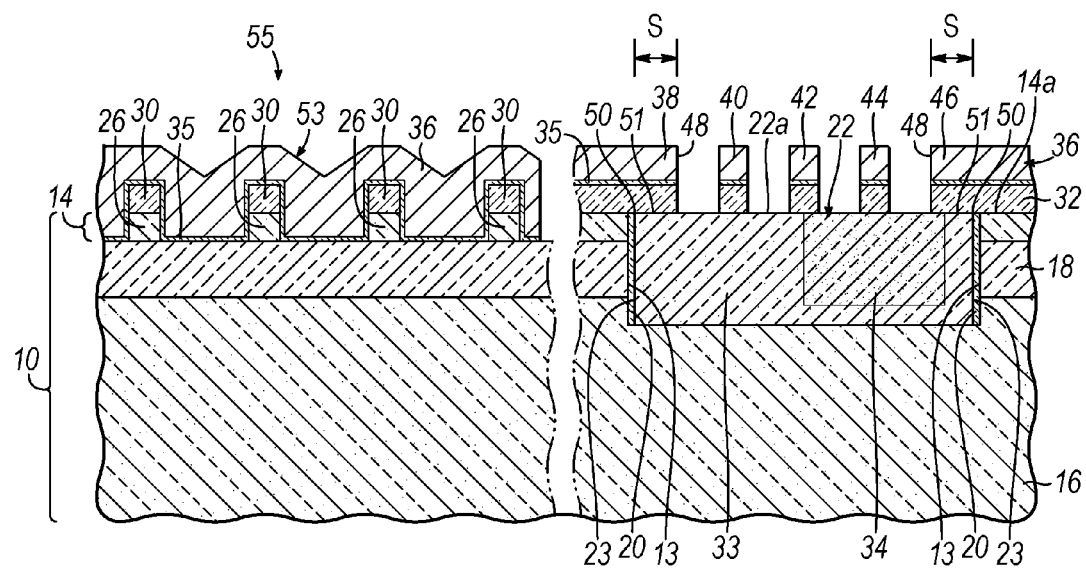

With reference to FIG. 4 in which like reference numerals refer to like features in FIG. 3 and at a subsequent fabrication stage, a gate dielectric layer 35 and a conductor layer 36 are applied across the SOI substrate 10. The conductor layer 36 is used in a subsequent fabrication stage of the processing method to form a mask used during the doping of the plug 22 to form the passive device structure. The conductor layer 36 is also used in the same subsequent fabrication stage to form one or more gates for the fins 26.

The gate dielectric layer 35 is comprised of an electrical insulator that has a dielectric constant (e.g., permittivity) characteristic of a dielectric material. In one embodiment, the gate dielectric layer 35 may be comprised of a high dielectric constant material with a relative permittivity (i.e., dielectric constant) above ten (10), which may include but are not limited to a metal oxide such as aluminum oxide ($Al_2O_3$), zirconium oxide ($ZrO_2$), tantalum pentoxide ($Ta_2O_5$), or hafnium oxide ($HfO_2$), a metal silicate such as a hafnium silicate ($HfSiO_4$) or hafnium oxynitride (HfSiON), or layered stacks of these and other similar materials. These types of electrical insulators may be deposited by atomic layer deposition (ALD), CVD, or another deposition technique. The conductor layer 36 is comprised of one or more layers of a material characterized by a high electrical conductivity. For example, the conductor layer 36 may be comprised of polycrystalline silicon (e.g., polysilicon) deposited by CVD or physical vapor deposition (PVD).

The gate dielectric layer 35 and conductor layer 36 are patterned to form a sacrificial mask layer including a plurality of strips 38, 40, 42, 44, 46 that coincide with the location of the plug 22. The strips 38, 46, in combination with sacrificial masks described hereinbelow, define edges of a sidewall 48 that establishes an outer perimeter for formation of the various heavily-doped regions defining the device structure for the passive device formed using the plug 22. The sidewall 48 is inset inside of a corner 50 of the plug 22 so that the conductor layer 36, gate dielectric layer 35, and cap material layer 32 overlap the plug 22 by a distance, S, and cover a peripheral edge 51 on the top surface 22a. The arrangement of strips 38, 40, 42, 44, 46 defines openings 39, 41, 43, 45 that expose correlated strips on the top surface 22a of the plug 22.

The openings 39, 41, 43, 45 may be utilized to form heavily-doped regions of semiconductor material in the plug 22. Strip 38 partially overlaps with the well 33 and the overlapped portion underlies the peripheral edge 51. Strip 46 partially overlaps with the well 34 and the overlapped portion underlies the peripheral edge 51. These overlapping relationships operate in the final device structure to position lightly-doped semiconductor material between the sidewalls 23 and corner 50 of the plug 22 and the heavily-doped regions subsequently defined using the openings 39, 41, 43, 45. The junction structures defined by the heavily-doped regions may be characterized as gate-bound junction structures in that the strips 38, 40, 42, 44, 46 of a gate stack provide implant alignment for the heavily-doped regions and may subsequently function to block silicide formation when contacts to the heavily-doped regions are formed.

In the representative embodiment, the patterning of the conductor layer 36 also forms a gate 53 for a FinFET 55, which is a single non-planar device structure constructed with multiple fins 26. The gate 53 is electrically insulated from the fins 26 by the gate dielectric layer 35 in a gate stack. Alternatively, the gate dielectric layer 35 and conductor layer 36 may be patterned to define multiple FinFETs each having an individual gate stack that overlaps at least one but not all of the fins 26. Additional FinFETs like FinFET 55 may be formed using fins similar to fins 26 in order to fabricate a FinFET-based integrated circuit on the SOI substrate 10.

In an alternative embodiment, the gate dielectric layer 35 and conductor layer 36 may be completely removed from the plug 22 during the patterning operation and replaced by an additive mask layer that is patterned to provide the strips 38, 40, 42, 44, 46. The additive mask layer comprises a material that is deposited on the top surface 22a of the plug 22 after the gate dielectric layer 35 and conductor layer 36 are removed from the plug 22. For example, the additive mask layer may be a resist layer applied by spin coating, pre-baked, exposed in a lithography tool to radiation projected through a photomask to impart a latent image of the strips 38, 40, 42, 44, 46, baked, and then developed with a chemical developer. The patterned mask layer has an appearance identical or substantially identical to the patterned gate dielectric layer 35 and conductor layer 36 in FIG. 5. The mask layer may be comprised of a layer of a dielectric material and, in particular, may be comprised of a silicide blocking (sblk) material, such as a nitride, oxide, or oxynitride of silicon deposited by CVD or PVD, that is used in a CMOS process to block silicide formation. The junction structures defined by the heavily-doped regions may be characterized as sblk-bound junction structures in that the strips 38, 40, 42, 44, 46 of silicide blocking material provide implant alignment for the heavily-doped regions and may subsequently function to block silicide formation when contacts to the heavily-doped regions are formed.

Figure 5:
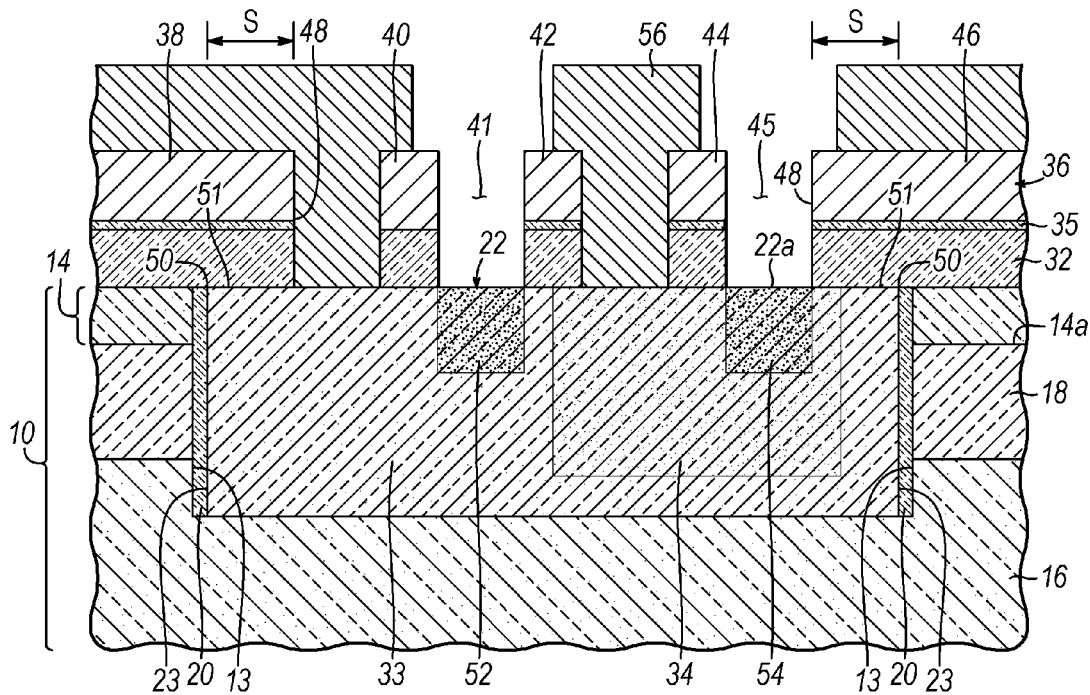
FIGS. 5-7 are cross-sectional views of the substrate portion of FIG. 4 for the passive device at successive fabrication stages of the processing method.

With reference to FIG. 5 in which like reference numerals refer to like features in FIG. 4 and at a subsequent fabrication stage, doped regions 52, 54 are formed in the plug 22 following the formation of a patterned mask 56. Doped region 52, which is laterally disposed within well 33 of lightly-doped semiconductor material, is comprised of semiconductor material having an opposite conductivity type from well 33. Doped region 54, which is laterally disposed within the well 34 of lightly-doped semiconductor material, is comprised of semiconductor material having the same conductivity type as well 34 but with a higher doping concentration and a higher electrical conductivity (i.e., lower electrical resistivity).

In the representative embodiment, the doped regions 52, 54 may be concurrently formed by ion implantation. To that end, the patterned mask 56 covers the openings 39, 43 and ions of an impurity species are implanted through openings in the mask 56 that coincide with openings 41, 45. The mask 56 may be, for example, a resist layer having openings respectively aligned with the openings 41, 45 representing the intended locations for the doped regions 52, 54 and formed using a photolithographic patterning process with a thickness sufficient to stop the implanted ions. The mask 56 and the strips 38, 46 collectively establish the sidewall 48 that is inset inside of the corner 50 of the plug 22 by the distance, S, to cover the peripheral edge 51 on the top surface 22a. The implantation conditions for forming doped regions 52, 54 are selected to provide a desired depth profile for the doping concentration and may include multiple implantation conditions. In one embodiment, the doped regions 52, 54 may be provided with n-type conductivity by implanting ions of a suitable n-type impurity species. The semiconductor material of the plug 22 aligned with openings 39, 43 does not receive a concentration of the implanted ions because of blocking by the mask 56, which stops the ions within its thickness. After ion implantation is complete, the mask 56 is removed.

Figure 6:
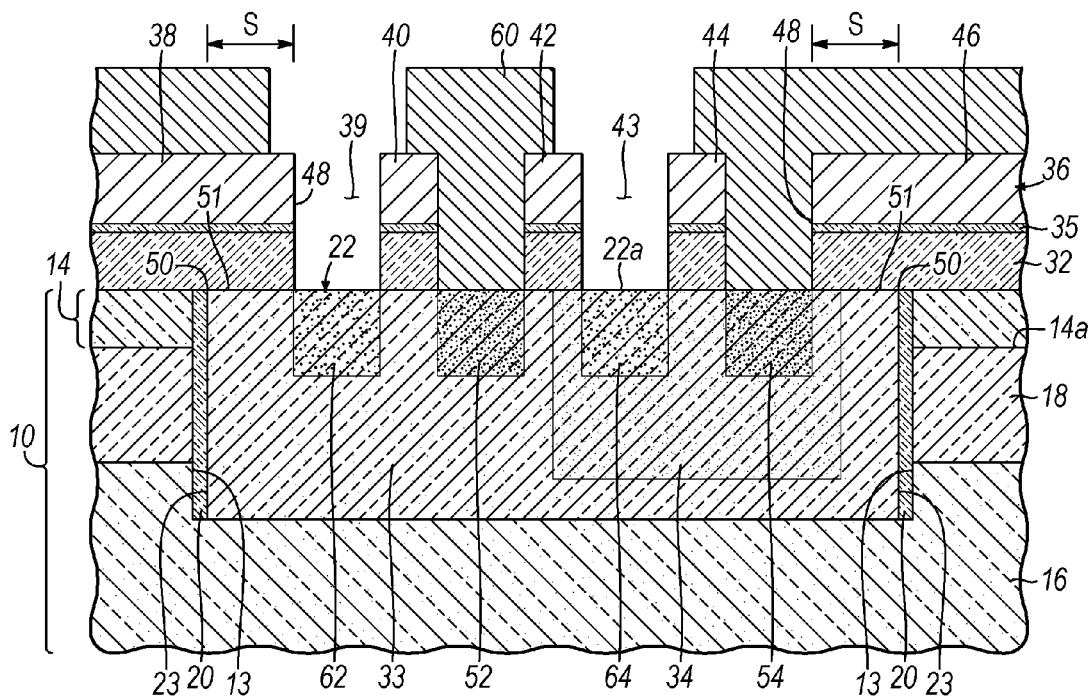

With reference to FIG. 6 in which like reference numerals refer to like features in FIG. 5 and at a subsequent fabrication stage, doped regions 62, 64 are formed in the plug 22 and may be formed either before or after the formation of doped regions 52, 54. Doped region 62, which is laterally disposed within the well 33 of lightly-doped semiconductor material, is comprised of semiconductor material having the same conductivity type as well 33 but with a higher doping concentration and a higher electrical conductivity (i.e., lower electrical resistivity). Doped region 64, which is laterally disposed in the well 34 of lightly-doped semiconductor material, is comprised of semiconductor material having an opposite conductivity type from well 34.

In the representative embodiment, the doped regions 62, 64 may be concurrently formed by ion implantation. To that end, openings 41, 45 are covered by a patterned mask 60 and ions of an impurity species are implanted through openings in the mask 60 that coincide with openings 39, 43. The mask 60 may be, for example, a resist layer having openings respectively aligned with the openings 39, 43 representing the intended locations for the doped regions 62, 64 and formed using a photolithographic patterning process. The mask 60 and the strips 38, 46 collectively establish the sidewall 48 that is inset inside of the corner 50 of the plug 22 by the distance, S, to cover the peripheral edge 51 on the top surface 22a. The implantation conditions for forming doped regions 62, 64 are selected to provide a desired depth profile for the doping concentration and may include multiple implantation conditions. In one embodiment, the doped regions 62, 64 may be provided with p-type conductivity by implanting ions of a suitable p-type impurity species. The semiconductor material of the plug 22 aligned with openings 41, 45 does not receive a concentration of the implanted ions because of blocking by the mask 60, which stops the ions within its thickness. After ion implantation is complete, the mask 60 is removed.

In an alternative embodiment, the masks 56, 60 may be used to form the doped regions 52, 54, 62, 64 in a process flow that lacks self-alignment with a hardmask. Specifically, the gate dielectric layer 35 and conductor layer 36 may be completely removed from the plug 22 during the patterning operation and not replaced by an additive mask layer. Instead, the mask 56 is used to form doped regions 52, 54 and mask 60 is used to form doped regions 62, 64 in the absence of a hardmask. To form doped regions 52, 54, the mask 56 is patterned such that gaps equivalent to openings 41, 45 are formed. The mask 56 and the strips 38, 46 collectively establish the sidewall 48 that is inset inside of the corner 50 of the plug 22 by the distance, S, to cover the peripheral edge 51 on the top surface 22a. To form doped regions 62, 64, the mask 60 is patterned such that openings equivalent to openings 39, 43 are formed. The mask 60 and the strips 38, 46 collectively establish the sidewall 48 that is inset inside of the corner 50 of the plug 22 by the distance, S, to cover the peripheral edge 51 on the top surface 22a.

Figure 7:
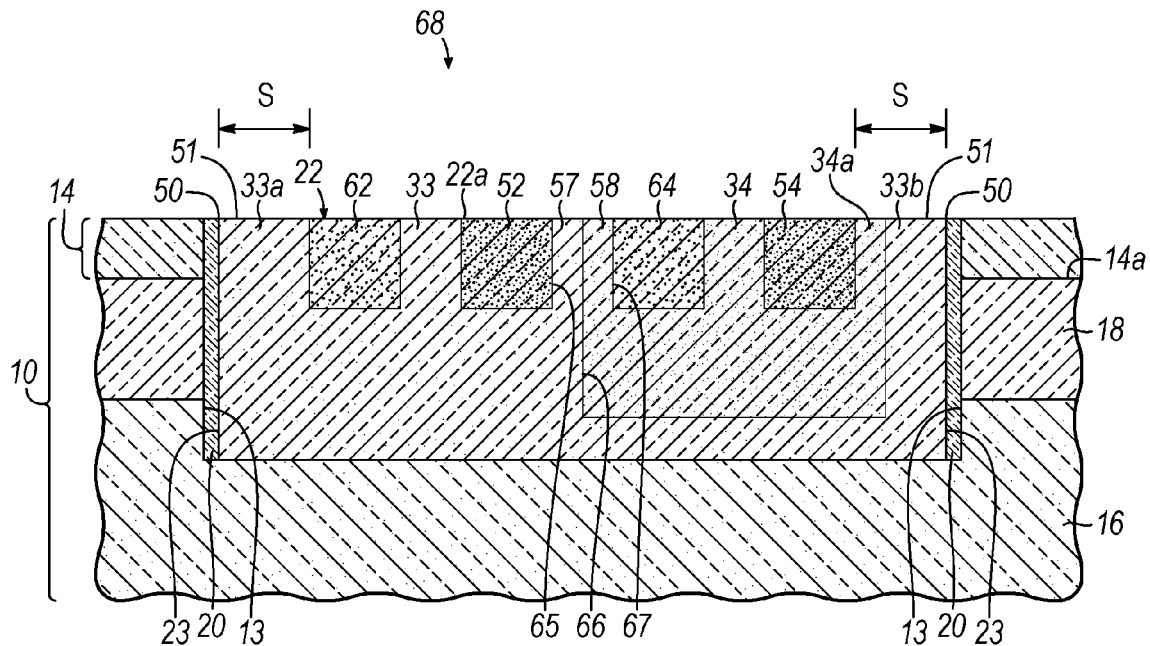
Figure 8:
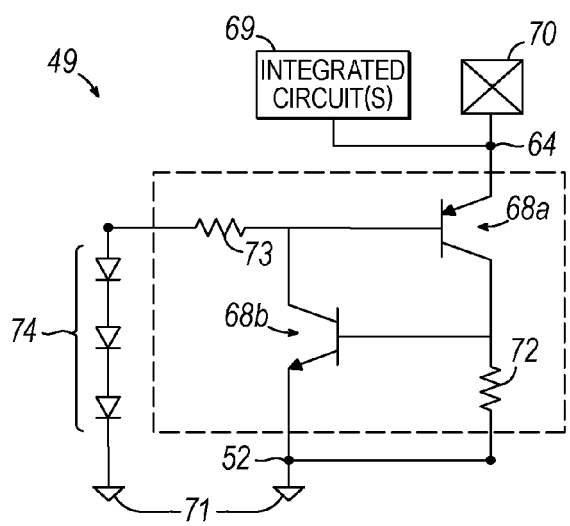
FIG. 8 is a schematic view of an electrical configuration for the device structure of FIG. 7.

With reference to FIGS. 7 and 8 in which like reference numerals refer to like features in FIG. 6 and at a subsequent fabrication stage, the strips 38, 40, 42, 44, 46 may be removed from the plug 22 by etching. The FinFET 55 is masked during the removal. The plug 22, as well as the wells 33, 34 and the doped regions 52, 54, 62, 64 in the plug 22, are unaffected by the etching. An anneal, such as a rapid thermal anneal, may be employed to electrically activate the implanted impurity species and to alleviate any implantation damage in wells 33, 34 and doped regions 52, 54, 62, 64.

A passive device 68, which is a silicon controlled rectifier (SCR) in the representative embodiment, is provided as a lateral, planar four-layer structure of alternating conductivity types and three p-n junctions 65, 66, 67 across which the conductivity type of the layered semiconductor material changes. The SCR represented by the passive device 68 is comprised of cross-coupled parasitic PNP and NPN bipolar transistors 68a, 68b (FIG. 8). The p-n junction 65 is defined along an interface between doped region 52 and a portion 57 of the well 33. This p-n junction 65 produced by the abutment of well 33 and doped region 52 also represents the junction for a diode. The p-n junction 66 is defined along an interface between the portion 57 of well 33 and a portion 58 of well 34. The p-n junction 67 is defined along an interface between the portion 58 of well 34 and doped region 64. This p-n junction 67 produced by the abutment of well 34 and doped region 64 also represents the junction for a diode.

The doped region 52 may represent a cathode of the passive device 68, and the doped region 64 may represent an anode of the passive device 68. The doped region 54 may provide another body contact, which in the representative embodiment is an n-body contact that contacts the n-well represented by well 34. The doped region 62 may provide a body contact, which in the representative embodiment is a p-body contact that contacts the p-well represented by well 33.

The passive device 68 may be used as a protection element in an electrostatic discharge (ESD) protection circuit 49 configured to discharge current from an ESD pulse or, alternatively, the passive device 68 may be used in a different type of circuit that does not involve ESD protection.

In use as a protection element in the ESD protection circuit 49, the passive device 68 and one or more protected integrated circuits 69 may be electrically coupled by a common signal path to an input/output (I/O) pad 70. More specifically, the doped region 64 (i.e., the anode of the passive device 68) may be coupled with the I/O pad 70 and the protected integrated circuits 69 and the doped region 52 (i.e., the cathode of the passive device 68) may be coupled to the ground buss at a ground pad 71. The ground pad 71 is grounded even when the protected integrated circuits 69 are not powered. Wells 33, 34 define electrical resistances 72, 73 in the ESD protection circuit 49.

The one or more protected integrated circuits 69 may include the FinFET 55 formed using the fins 26 and other similar FinFETs. When the protected integrated circuits 69 are powered, the passive device 68 will present a high impedance between the I/O pad 70 and the ground buss at ground pad 71 so that signals communicated over the signal path between the I/O pad 70 and the integrated circuits 69 are substantially unaffected by the presence of the passive device 68.

The gate of the PNP bipolar transistor 68a is coupled with a drive circuit 74, which may be a diode string. The drive circuit 74 of the ESD protection circuit 49 responds to the voltage from an ESD pulse by triggering the passive device 68 to enter a low-impedance conducting state and thereby provide a current-carrying path for the ESD current from the I/O pad 70 to the ground pad 71. The current-carrying path includes the doped regions 52, 64 and the portions of wells 33, 34 between doped regions 52, 64. When triggered, the passive device 68 is induced to enter the low-impedance conducting state by the ESD pulse and thereby divert the ESD pulse through the current-carrying path and away from the protected integrated circuits 69. In response to the ESD current flowing through the passive device 68, the bipolar transistors 68a, 68b hold each other in the low-impedance conducting state and the low impedance conductive state persists. At the conclusion of the ESD event, the passive device 68 reverts to the high-impedance non-conducting state and remains off until a trigger signal is applied in response to a future ESD event.

Well 33 includes a portion 33a that are laterally positioned between the doped region 62 and the nearest-neighbor sidewall 23 and corner 50 of the plug 22. Well 33 also includes a portion 33b that is laterally positioned between the doped region 54 and the nearest-neighbor sidewall 23 and corner 50 of the plug 22. Well 34 includes a portion 34a that is laterally positioned between the doped region 54 and the sidewalls 23 and corner 50 of the plug 22. The portion 33b of well 33 is also disposed between the portion 34a of well 34 and the nearest-neighbor sidewall 23.

The doped regions 52, 62 of the passive device 68, which are comprised of heavily-doped semiconductor material, are interiorly positioned inside the well 33 that is comprised of lightly-doped semiconductor material. The doped regions 54, 64 of the passive device 68, which are also comprised of heavily-doped semiconductor material of the opposite conductivity type, are interiorly positioned inside the well 34 that is comprised of lightly-doped semiconductor material. Specifically, the doped regions 52, 54, 62, 64 of heavily-doped semiconductor material may be spaced inward from the sidewalls 23 and corner 50 (i.e., the outer perimeter of the top surface 22a of plug 22). In particular, the distance, S, between doped region 54 and the nearest-neighbor sidewall 23 and corner 50 of plug 22 is occupied by the portion 33a of well 33, and the distance, S, between doped region 62 and the nearest-neighbor sidewall 23 and corner 50 of plug 22 is occupied by the portion 33b of well 33 and the portion 34a of well 34. As a result, doped region 62 is separated from its nearest-neighbor sidewall 23 and corner 50 by lightly-doped semiconductor material of one conductivity type and doped region 54 is separated from its nearest-neighbor sidewall 23 and corner 50 by lightly-doped semiconductor material of both conductivity types.

This intentional inward spacing by distance, S, may provide spatial clearance to account for uncertainty in the physical location of the doped regions 52, 54, 62, 64. The intentional inward spacing by distance, S, may also enhance the electrical control over the passive device 68 by supplying a guard structure between the doped regions 52, 54, 62, 64 and the sidewalls 23 and corner 50.

The passive device 68 is formed on the same SOI substrate 10 as the FinFET 55. The passive device 68 is electrically isolated from the FinFET 55 by the buried insulator layer 18 and without the aid of lateral isolation structures, such as shallow trench isolation regions. Standard processing follows the formation of the passive device 68 to provide contacts to the various doped regions 52, 54, 62, 64 and a back-end-of-line (BEOL) interconnect structure.

Figure 9:
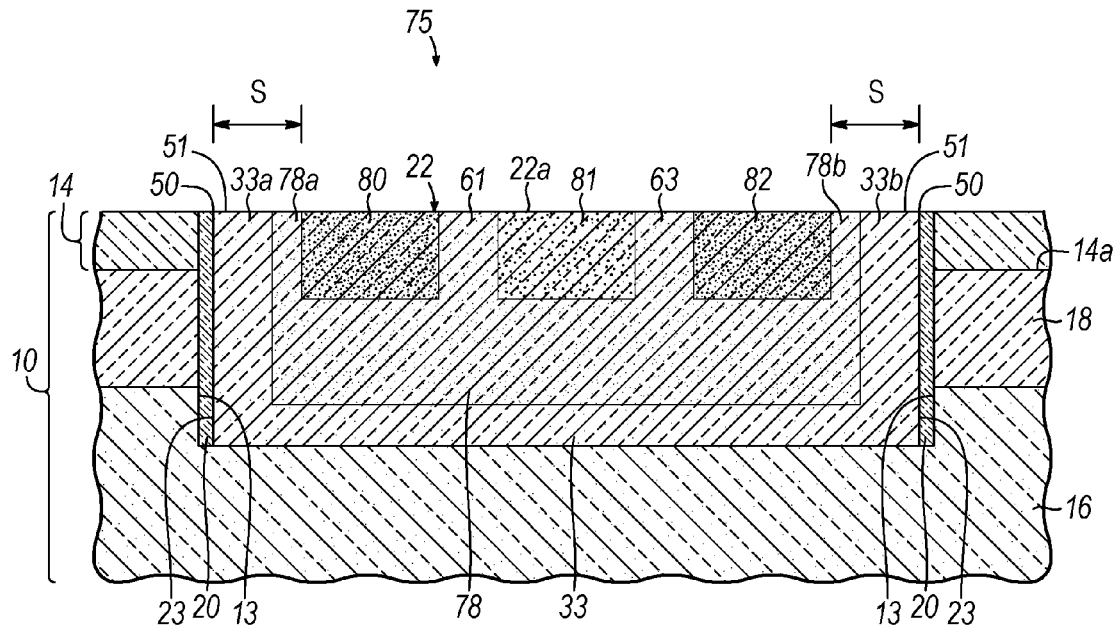
FIG. 9-12 are cross-sectional views similar to FIG. 7 of device structures for a passive device that are constructed in accordance with alternative embodiments of the invention.

With reference to FIG. 9 in which like reference numerals refer to like features in FIG. 7 and in accordance with an alternative embodiment, a passive device 75 may be formed using the plug 22 that differs from the passive device 68 (FIG. 7). Specifically, the process forming the well 34 may be altered such that a well 78 similar to well 34 occupies the majority of the plug 22. The well 78 is resident in a tub defined by well 33 having the original conductivity type of the plug 22. Counterdoping of well 33 during the formation of well 78 defines an interior boundary of well 33 and an exterior boundary of well 78 across which the wells 33, 78 are coextensive and across which the conductivity type of the semiconductor material of plug 22 changes.

The process flow used to form the passive device 68 is also altered in connection with the formation of the heavily-doped regions 52, 54, 62, 64 such that only three heavily-doped regions 80, 81, 82 are formed in the plug 22 and such that each of these regions 80, 81, 82 is formed in the well 78. To that end, the number of strips 38, 40, 42, 44, 46 (FIG. 4) is altered by unity to reduce the number of openings 39, 41, 43, 45 by unity so that only four strips and three openings are present. The locations and arrangement of the strips determines the location and arrangement of the doped regions 80, 81, 82.

The doped regions 80, 82 are formed by an impurity introduction process, such as ion implantation, while the intended location for doped region 81 and the remainder of wells 33, 78 are masked. Doped regions 80, 82 are comprised of heavily-doped semiconductor material having the same conductivity type as the lightly-doped well 78 and are used to supply well contacts. Doped region 81 is formed by an impurity introduction process, such as ion implantation, while the doped regions 80, 82 and the remainder of wells 33, 78 are masked. The heavily-doped doped region 81 is laterally disposed between the doped regions 80, 82 and is comprised of semiconductor material having the opposite conductivity type from the lightly-doped well 78.

A portion 78a of well 78 may be laterally positioned between the doped region 80 and the nearest-neighbor sidewall 23 and corner 50 of the plug 22. A portion 78b of well 78 may be laterally positioned between the doped region 82 and the nearest-neighbor sidewall 23 and corner 50 of the plug 22. One or both of portions 61, 63 of the well 78 may form a p-n junction with the doped region 81.

The doped regions 80, 81, 82 of heavily-doped semiconductor material may be spaced inward from the sidewalls 23 and corner 50 of plug 22. In particular, the distance, S, between doped region 80 and the nearest-neighbor sidewall 23 and corner 50 of plug 22 is occupied by the portion 33a of well 33 and the portion 78a of well 78, and the distance, S, between doped region 82 and the nearest-neighbor sidewall 23 and corner 50 of plug 22 is occupied by the portion 33b of well 33 and the portion 78a of well 78. As a result, doped region 80 and the doped region 82 are each separated from its nearest-neighbor sidewall 23 and corner 50 by lightly-doped semiconductor material of both conductivity types.

In one embodiment, the well 78 may be comprised of lightly-doped n-type semiconductor material to define an n-well, the doped regions 80, 82 may be comprised of heavily-doped n-type semiconductor material, and the doped region 81 may be comprised of heavily-doped p-type semiconductor material. This arrangement of oppositely doped layers defines a $p^+$/n-well diode as the passive device 75. Doped region 81 serves as a cathode, well 78 serves as an anode, and the well 78 and doped region 81 are butted to define a p-n junction.

Similar to passive device 68, the passive device 75 may be utilized as an ESD protection element in an ESD protection circuit. Alternatively, the passive device 75 may be used in a different type of circuit that does not involve ESD protection.

Figure 10:
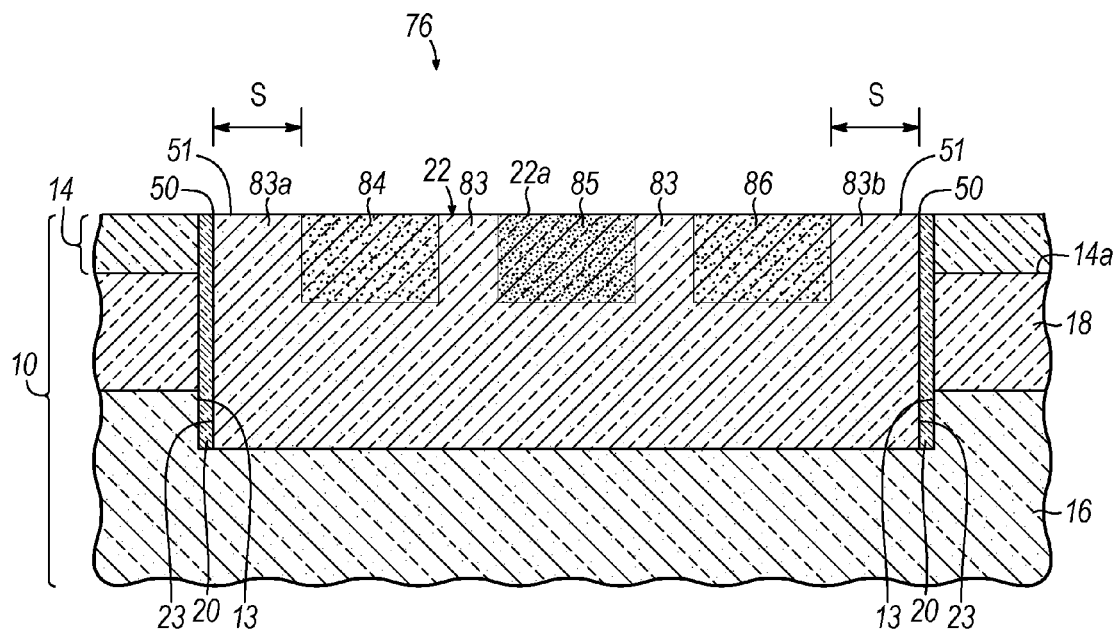

With reference to FIG. 10 in which like reference numerals refer to like features in FIG. 7 and in accordance with an alternative embodiment, a passive device 76 may be formed using the plug 22 that differs from the passive device 68 (FIG. 7) and passive device 75 (FIG. 9). The formation of well 34 is omitted from the process flow so that only a single well 83 similar to well 33 is present and occupies the entirety of plug 22 as a doped region. As a result, the well 83 represents a well of a single conductivity type that is used for device formation.

The process flow used to form the passive device 68 is also altered in connection with the formation of the heavily-doped regions 52, 54, 62, 64 such that only three heavily-doped regions 84, 85, 86 are formed in the plug 22 and such that each of these regions 84, 85, 86 is formed in the well 83. To that end, the number of strips 38, 40, 42, 44, 46 (FIG. 4) is altered by unity to reduce the number of openings 39, 41, 43, 45 by unity so that only four strips and three openings are present. The locations and arrangement of the strips determines the location and arrangement of the doped regions 84, 85, 86.

The doped regions 84, 86 are formed by an impurity introduction process, such as ion implantation, while the intended location for doped region 85 and the remainder of well 83 are masked. Doped regions 84, 86 are comprised of semiconductor material having the same conductivity type as the well 83 and are used to supply well contacts. The doped region 85 is formed by an impurity introduction process, such as ion implantation, while the doped regions 84, 86 and the remainder of well 83 are masked. The doped region 85 is laterally disposed between the doped regions 84, 86 and is comprised of semiconductor material having the opposite conductivity type from the well 83.

A portion 83a of well 83 may be laterally positioned between the doped region 84 and the nearest-neighbor sidewall 23 and corner 50 of the plug 22. A portion 83b of well 83 may be laterally positioned between the doped region 86 and the nearest-neighbor sidewall 23 and corner 50 of the plug 22. The sidewalls 23 and corner 50 of plug 22 are also separated from the doped region 85 by the portions 83a, 83b of lightly-doped well 83.

The doped regions 84, 85, 86 of heavily-doped semiconductor material may be spaced inward from the sidewalls 23 and corner 50 of plug 22. In particular, the distance, S, between doped region 84 and the nearest-neighbor sidewall 23 and corner 50 of plug 22 is occupied by the portion 83a of well 83, and the distance, S, between doped region 86 and the nearest-neighbor sidewall 23 and corner 50 of plug 22 is occupied by the portion 83b of well 83. As a result, doped region 84 and the doped region 86 are each separated from its nearest-neighbor sidewall 23 and corner 50 by lightly-doped semiconductor material of the same conductivity type.

In one embodiment, the well 83 may be comprised of lightly-doped p-type semiconductor material to define a p-well, the doped regions 84, 86 may be comprised of heavily-doped p-type semiconductor material, and the doped region 85 may be comprised of heavily-doped n-type semiconductor material. This layered arrangement defines a lateral, planar $n^+$/p-well diode as the passive device 76. Doped region 85 serves as a cathode, well 83 serves as an anode, and portions of the well 83 and doped region 85 are butted to define a p-n junction.

Similar to passive device 68, the passive device 76 may be utilized as an ESD protection element in an ESD protection circuit. Alternatively, the passive device 76 may be used in a different type of circuit that does not involve ESD protection.

Figure 11:
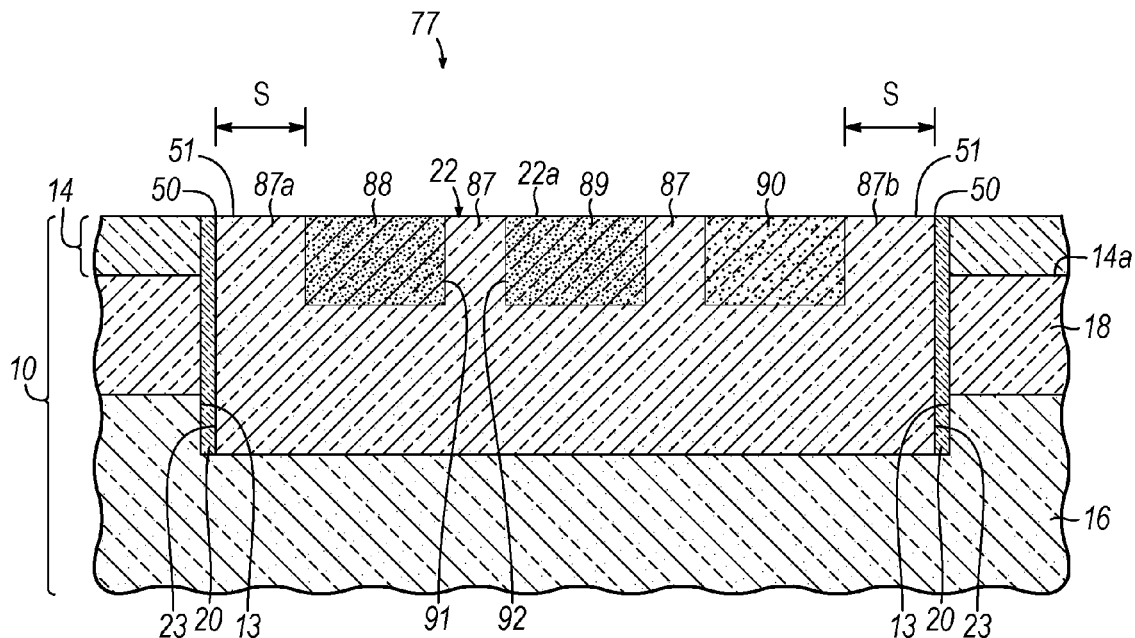

With reference to FIG. 11 in which like reference numerals refer to like features in FIG. 7 and in accordance with an alternative embodiment, a passive device 77 may be formed using the plug 22 that differs from the passive device 75 (FIG. 9) and the passive device 68 (FIG. 7). The formation of well 34 is omitted from the process flow so that only a single well 87 similar to well 33 is present and occupies the entirety of plug 22 as a doped region. As a result, the well 87 represents a well of a single conductivity type that is used for device formation.

Similar to the process flow used to form the passive device 75, only three heavily-doped regions 88, 89, 90 are formed in the plug 22 and well 33. As discussed above in connection with the formation of passive device 75, this modification is accomplished by altering the number of strips 38, 40, 42, 44, 46 (FIG. 4) by unity to reduce the number of openings 39, 41, 43, 45 by unity so that only four strips and three openings are present. The locations and arrangement of the strips determines the location and arrangement of the doped regions 88, 89, 90.

The doped regions 88, 89 are formed by an impurity introduction process, such as ion implantation, while the intended location for doped region 90 and the remainder of well 87 are masked. The doped regions 88, 89 are comprised of semiconductor material having an opposite conductivity type from the well 87 and are laterally adjacent to each other. As a result, a p-n junction 91 is defined along an interface between a portion of well 87 between doped regions 88, 89 and doped region 88 across which the conductivity type changes. Another p-n junction 92 is defined along an interface between the same portion of well 87 and doped region 89 across which the conductivity type also changes.

The doped region 90 is formed by an impurity introduction process, such as ion implantation, while the doped regions 88, 89 and the remainder of the well 87 are masked. The doped region 90 is comprised of semiconductor material having the same conductivity type as the well 87 and is used to supply a well contact.

A portion 87a of lightly-doped well 87 may be laterally positioned between the doped region 88 and the nearest-neighbor sidewall 23 and corner 50 of the plug 22. A portion 87b of lightly-doped well 87 may be laterally positioned between the doped region 86 and the nearest-neighbor sidewall 23 and corner 50 of the plug 22. The doped regions 88, 89, 90 of heavily-doped semiconductor material and p-n junctions 91, 92 may be spaced inward from the sidewalls 23 and corner 50 of plug 22. In particular, the distance, S, between doped region 88 and the nearest-neighbor sidewall 23 and corner 50 of plug 22 is occupied by the portion 87a of well 87, and the distance, S, between doped region 90 and the nearest-neighbor sidewall 23 and corner 50 of plug 22 is occupied by the portion 87b of well 87. As a result, doped region 88 and the doped region 90 are each separated from its nearest-neighbor sidewall 23 and corner 50 by lightly-doped semiconductor material of the same conductivity type.

In one embodiment, the well 87 may be comprised of lightly-doped p-type semiconductor material to define a p-well, the doped regions 88, 89 may be comprised of heavily-doped n-type semiconductor material, and the doped region 90 may be comprised of heavily-doped p-type semiconductor material. This arrangement of oppositely doped layers defines a lateral, planar NPN bipolar junction transistor as the passive device 77. The doped regions 88 and 89 define the emitter and collector of the NPN bipolar junction transistor and the portion of well 87 between the doped regions 88, 89 defines the base of the NPN bipolar junction transistor. The p-n junction between the n-type collector and the p-type base is the collector-base junction that has the base as the anode and the collector as the cathode. The p-n junction between the n-type emitter and the p-type base is the emitter-base junction that has the base as the anode and the emitter as the cathode.

In another embodiment, the well 87 may be comprised of lightly-doped n-type semiconductor material to define a n-well, the doped regions 88, 89 may be comprised of heavily-doped p-type semiconductor material, and the doped region 90 may be comprised of heavily-doped n-type semiconductor material. This arrangement of oppositely doped layers defines a lateral, planar PNP bipolar junction as the passive device 76.

Similar to passive devices 68, 75, 76, the passive device 77 may be employed as an ESD protection element in an ESD protection circuit. Alternatively, the passive device 77 may be used in a different type of circuit that does not involve ESD protection.

Figure 12:
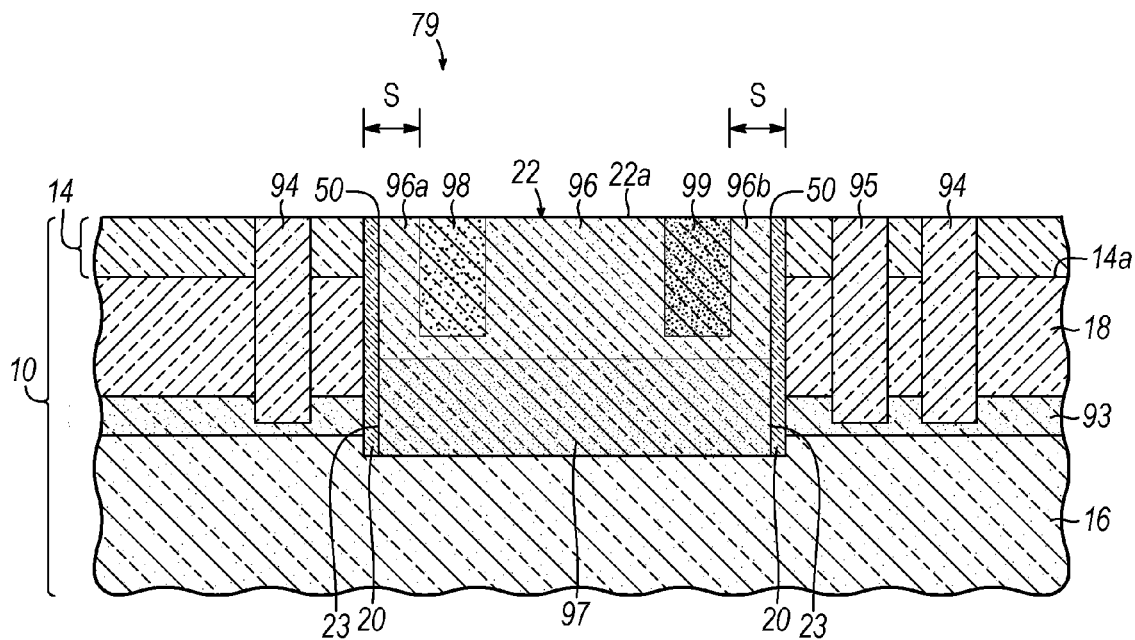

With reference to FIG. 12 in which like reference numerals refer to like features in FIG. 7 and in accordance with an alternative embodiment, the process flow may be modified to form a passive device 79 using the plug 22 that has a vertical architecture instead of the lateral architectures illustrated in FIG. 7 and FIGS. 9-11. Similar to passive device 68, the passive device 79 may be utilized as an ESD protection element in an ESD protection circuit. Alternatively, the passive device 79 may be used in a different type of circuit that does not involve ESD protection.

To that end, a vertically-confined band 93 is formed in the handle wafer 16 and has an opposite conductivity type from the handle wafer 16. A band contact 95 is formed that penetrates through the device layer 14 and the buried insulator layer 18 to contact the band 93. The band contact 95 may comprise heavily-doped polysilicon. Trench isolation regions 94 are formed that have sidewalls penetrating through the device layer 14, the buried insulator layer 18, and into the band 93. The trench isolation regions 94 may include electrical insulator spacers lining the trench holding the regions 94 and a different material, such as polysilicon, filling the remainder of the trench.

A lightly-doped well 96 similar to well 34 may be formed in the plug 22 by counterdoping the semiconductor material of the plug 22. The well 96 only occupies an upper section of the plug 22 so that another lightly-doped well 97 is formed in the lower section of the plug 22. The well 97 may retain the original conductivity type of the semiconductor material of the plug 22. The wells 96, 97 are suitably doped to have opposite conductivity types.

Similar to the process flow used to form the passive device 75, only two heavily-doped regions 98, 99 are formed in the plug 22 and well 96. This modification is accomplished by altering the number of strips 38, 40, 42, 44, 46 (FIG. 4) by two to reduce the number of openings 39, 41, 43, 45 by two so that only three strips and two openings are present. The locations and arrangement of the strips determines the location and arrangement of the doped regions 98, 99, which are comprised of semiconductor material of opposite conductivity types.

The doped region 98 is formed by an impurity introduction process, such as ion implantation, while the intended location for doped region 99 and the remainder of well 96 are masked. The doped region 98 is comprised of semiconductor material having the same conductivity type as the well 96. The doped region 99 is formed by an impurity introduction process, such as ion implantation, while the doped region 98 and the remainder of the well 96 are masked. The doped region 99 is comprised of semiconductor material having the same conductivity type as the well 96 and is used to supply a well contact.

A portion 96a of lightly-doped well 96 may be laterally positioned between the doped region 98 and the nearest-neighbor sidewall 23 and corner 50 of the plug 22. A portion 96b of lightly-doped well 96 may be laterally positioned between the doped region 99 and the nearest-neighbor sidewall 23 and corner 50 of the plug 22. The doped regions 98, 99 of heavily-doped semiconductor material may be spaced inward from the sidewalls 23 and corner 50 of plug 22. In particular, the distance, S, between doped region 98 and the nearest-neighbor sidewall 23 and corner 50 of plug 22 is occupied by the portion 96a of well 96, and the distance, S, between doped region 99 and the nearest-neighbor sidewall 23 and corner 50 of plug 22 is occupied by the portion 96b of well 96. As a result, doped region 98 and the doped region 99 are each separated from its nearest-neighbor sidewall 23 and corner 50 by lightly-doped semiconductor material of the same conductivity type.

The passive device 79 may be configured to operate as a vertical SCR. The device regions of the vertical SCR comprise the doped region 99, the lightly-doped well 96, the lightly-doped well 97, and the band 93. Doped region 98 supplies a contact to the well 96. P-n junctions are defined at the boundary between doped region 99 and the lightly-doped well 96, at the boundary between the lightly-doped well 96 and the lightly-doped well 97, and at the boundary between the lightly-doped well 97 and the band 93. In one embodiment, the well 96 may be comprised of lightly-doped n-type semiconductor material to define an n-well, the well 97 may be comprised of lightly-doped p-type semiconductor material to define a p-well, the doped region 98 may be comprised of heavily-doped n-type semiconductor material, and the doped region 99 may be comprised of heavily-doped p-type semiconductor material.

Alternatively, the passive device 79 may be configured to operate as a vertical bipolar junction transistor. The device regions of the bipolar junction transistor comprise the doped region 98, the lightly-doped well 97, and the band 93. P-n junctions are defined at the boundary between doped region 98 and the lightly-doped well 97, at the boundary between the lightly-doped well 96 and the lightly-doped well 97, and at the boundary between the lightly-doped well 97 and the band 93. In one embodiment, the well 96 may be comprised of lightly-doped n-type semiconductor material to define an n-well, the well 97 may be comprised of lightly-doped p-type semiconductor material to define a p-well, the doped region 98 may be comprised of heavily-doped n-type semiconductor material, and the doped region 99 may be comprised of heavily-doped p-type semiconductor material.

In another alternative embodiment, the passive device 79 may be configured to operate as a diode in which the device regions comprise the doped region 99 and the lightly-doped well 96. In this embodiment, the band 93, band contact 95, and trench isolation regions 94 may be omitted. The well 96 may be comprised of lightly-doped n-type semiconductor material to define an n-well and the doped region 99 may be comprised of heavily-doped p-type semiconductor material, while the doped region 98 may be comprised of heavily-doped n-type semiconductor material to serve as a contact to the well 96. This arrangement of oppositely doped layers defines a $p^+$/n-well diode as the passive device 79. Doped region 99 serves as a cathode, well 96 serves as an anode, and the well 96 and doped region 99 are butted to define a p-n junction.

In yet another alternative embodiment, the passive device 79 may be configured to operate as a diode in which the device regions comprise the doped region 98 and the lightly-doped well 97. In this embodiment, the band 93, band contact 95, and trench isolation regions 94 may be omitted, as well as the lightly-doped well 96 so that the entirety of the plug 22 operates as the lightly-doped well 97. The well 97 may be comprised of lightly-doped p-type semiconductor material to define an n-well and the doped region 98 may be comprised of heavily-doped n-type semiconductor material, while the doped region 99 may be comprised of heavily-doped p-type semiconductor material to serve as a contact to the well 97. This arrangement of oppositely doped layers defines an $n^+$/p-well diode as the passive device 79. Doped region 98 serves as a cathode, well 97 serves as an anode, and the well 97 and doped region 98 are butted to define a p-n junction.

Figure 13:
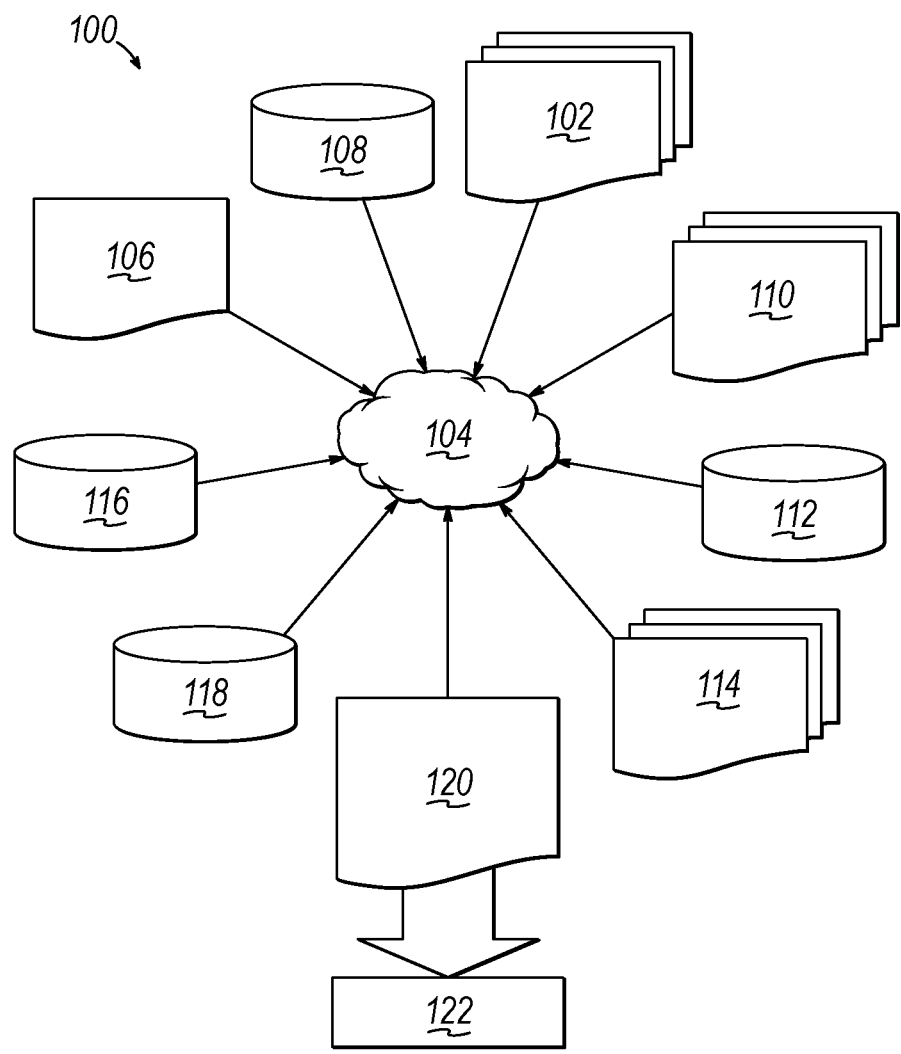
FIG. 13 is a flow diagram of a design process used in semiconductor design, manufacture, and/or test.

FIG. 13 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 7-11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 7-12. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7-12 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 7-12. In one embodiment, design structure 120 may comprise a compiled, executable HDL simulation model that functionally simulates the devices shown in FIGS. 7-12.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 7-12. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure using a semiconductor-on-insulator substrate having a device layer, a handle wafer, and a buried insulator layer separating the device layer from the handle wafer, the method comprising:
   forming a trench extending from a top surface of the device layer through the buried insulator layer and into the handle wafer;
   forming a device region in the trench that is coupled with the handle wafer and extends through the buried insulator layer toward the top surface of the device layer; and
   forming a first doped region in the device region that participates in defining a first junction,
   wherein the device region is comprised of lightly-doped semiconductor material, and a first portion of the device region is laterally positioned between the first doped region and the buried insulator layer.

2. The method of claim 1 wherein the device region has a first conductivity type, the first doped region has a second conductivity type opposite to the first conductivity type, and the first junction is defined between the first doped region and a second portion of the device region, and further comprising:
   forming a second doped region in the device region,
   wherein the second doped region is positioned in the device region between the first doped region and the buried insulator layer, and the first portion of the device region is laterally positioned between the second doped region and the buried insulator layer.

3. The method of claim 1 wherein the device region has a first conductivity type and the first doped region has the first conductivity type, and further comprising:
   forming a well of a second conductivity type opposite to the first conductivity type in the device region;
   forming a second doped region in the well,
   wherein the first junction is defined between the first doped region and the well, and the second doped region is positioned in the device region between the first doped region and the buried insulator layer, and the first portion of the device region is laterally positioned between the second doped region and the buried insulator layer.

4. The method of claim 1 wherein the device region has a first conductivity type, the first doped region has a second conductivity type opposite to the first conductivity type, and the first junction is defined between the first doped region and a second portion of the device region, and further comprising:

forming a well of the second conductivity type in the device region; and forming a doped region of the first conductivity type in the well that defines a second junction with a portion of the well, wherein the portion of the well is juxtaposed with the second portion of the device region to define a third junction, and the first doped region of the second conductivity type, the second portion of the device region, the portion of the well, and the doped region of the first conductivity type define a planar silicon controlled rectifier.

5. The method of claim 1 wherein the device region has a first conductivity type, the first doped region has a second conductivity type opposite to the first conductivity type, and the first junction is defined between the first doped region and a second portion of the device region, and further comprising:

forming a second doped region of the second conductivity type in the device region, wherein the first doped region, the second portion of the device region, and the second doped region define a lateral bipolar junction transistor.

6. The method of claim 1 wherein the device region has a first conductivity type, and the first doped region has a second conductivity type opposite to the first conductivity type.

7. The method of claim 1 wherein the device region has a first conductivity type, and comprising:

forming a well of a second conductivity type in the device region, wherein the first doped region has the first conductivity type and is positioned in the well, and the first junction is formed between the first doped region and a portion of the well.

8. The method of claim 1 further comprising:

patterning a portion of the device layer to form at least one fin for a fin-type field-effect transistor.

9. The method of claim 1 wherein forming the device region in the trench comprises:

epitaxially growing the lightly-doped semiconductor material using the handle wafer as a seed crystal.

10. The method of claim 1 wherein the lightly-doped semiconductor material of the device region includes a first well of a first conductivity type in an upper region of the trench and a second well of a second conductivity type in a lower region of the trench, the first doped region has the second conductivity type and is coextensive with a portion of the first well to define the first junction, and further comprising:

forming a band of the first conductivity type in the handle wafer and coextensive with a portion of the second well to form a second junction, wherein the portion of the second well is juxtaposed with the first portion of the first well to define a third junction.

11. The method of claim 1 wherein the lightly-doped semiconductor material of the device region comprises a first well of a first conductivity type in an upper region of the trench and a second well of a second conductivity type in a lower region of the trench, the first doped region has the first conductivity type and is coextensive with a portion of the second well to define the first junction, and further comprising:

forming a band of the first conductivity type in the handle wafer and coextensive with the portion of the second well to form a second junction.

* * * * *